United States Patent [19]

Casciani

[11] Patent Number: 4,508,965
[45] Date of Patent: Apr. 2, 1985

[54] UNIAXIALLY COLLIMATED LIGHT SOURCE FOR OPTICAL SHAFT ANGLE ENCODERS

[75] Inventor: James R. Casciani, Palo Alto, Calif.

[73] Assignee: Hewlett-Packard Company, Palo Alto, Calif.

[21] Appl. No.: 355,002

[22] Filed: Mar. 5, 1982

[51] Int. Cl.³ .............................................. G01D 5/34
[52] U.S. Cl. ......................... 250/231 SE; 250/237 G
[58] Field of Search ..................... 250/231 SE, 237 G; 356/395; 340/347 P

[56] References Cited

U.S. PATENT DOCUMENTS 3,999,064  12/1976  Kramer .......................... 340/347 P
4,263,506   4/1981  Epstein ........................ 250/231 SE
4,317,032   2/1982  Hanus et al. .................. 250/231 SE
4,319,134   3/1982  Weber .......................... 250/231 SE Primary Examiner—Davis L. Willis
Assistant Examiner—J. Jon Brophy
Attorney, Agent, or Firm—Douglas A. Kundrat

[57] ABSTRACT

An optical shaft angle encoder uses novel slit emitters having a long, narrow, configuration coupled with collimation lenses to utilize emitted light beams having an improved degree of collimation in an axis perpendicular to radial axes of a rotating code wheel and, thereby, to provide a higher quality generated electrical waveform which is used to describe shaft rotation. The slit emitters are narrowed to improve collimation uniaxially and lengthened to increase the total power of the emitted light.

9 Claims, 5 Drawing Figures

UNIAXIALLY COLLIMATED LIGHT SOURCE FOR OPTICAL SHAFT ANGLE ENCODERS

BACKGROUND AND SUMMARY OF THE INVENTION

The quality of an electrical waveform which is generated by an optical shaft angle encoder of the type described in U.S. Pat. No. 4,266,125, which is expressly incorporated herein by reference, is related to the degree of collimation of the light beams which are used to detect shaft rotation. The degree of collimation is, in turn, related to both the physical size of the emitters which are used to generate the light flux and to the focal length of the collimation lenses which are used to create collimated light beams from the light flux. Thus, for optimal performance, a point source is ideal as a collimated light source. However, the emitted light from a point source emitter is generally insufficient for use, and the emitter size needs to be increased. As the physical size of an emitter is increased in order to increase the total power of the emitted light, the shadows cast by an optical encoder, for example, spokes of a rotating code wheel, becomes increasingly blurred and indistinct. A disadvantageous result of the use of blurred shadows is that the electrical waveform generated by the optical encoder is degraded from an optimal pure triangle waveform to a rounded triangle waveform having a lower signal-to-noise ratio. The shadow-blurring effect of increased emitter size has been somewhat reduced in optical shaft angle encoders constructed according to the prior art by minimizing the size of the gap between the code wheel and the phase plate. This attempted solution has the major disadvantages of complicating the mechanical design of the optical shaft angle encoder while also increasing the risk of mechanical failure due to the necessary proximity of the phase plate to the rotating code wheel.

In a preferred embodiment of the present invention an optical shaft angle encoder utilizes slit emitters which are positioned so that the slit emitters are aligned with the collimation lenses, the code wheel spokes, and phase plate apertures. The slit emitters are configured to have a narrow width perpendicular to the radial axis of the code wheel and a length coincidental to a code wheel radial axis. The degree of light collimation, in the direction perpendicular to the code wheel radial axis, is thus dependent upon the width of the slit emitters. Therefore, degree of light collimation in this direction, viz., in an axis perpendicular to the length, shadow distinctness, and waveform clarity are all maximized at a given gap size and a given collimation lens focal length by minimizing the width of the slit emitters to uniaxially approximate light emission from a point source. At the same time, the total power of the light generated by the slit emitters can be increased, as needed, merely by increasing the length of the slit emitters without necessitating the use of increased emitter current densities or enlargement of the point source as required in the prior art.

DESCRIPTION OF THE PREFERRED EMBODIMENT

Figure 1:
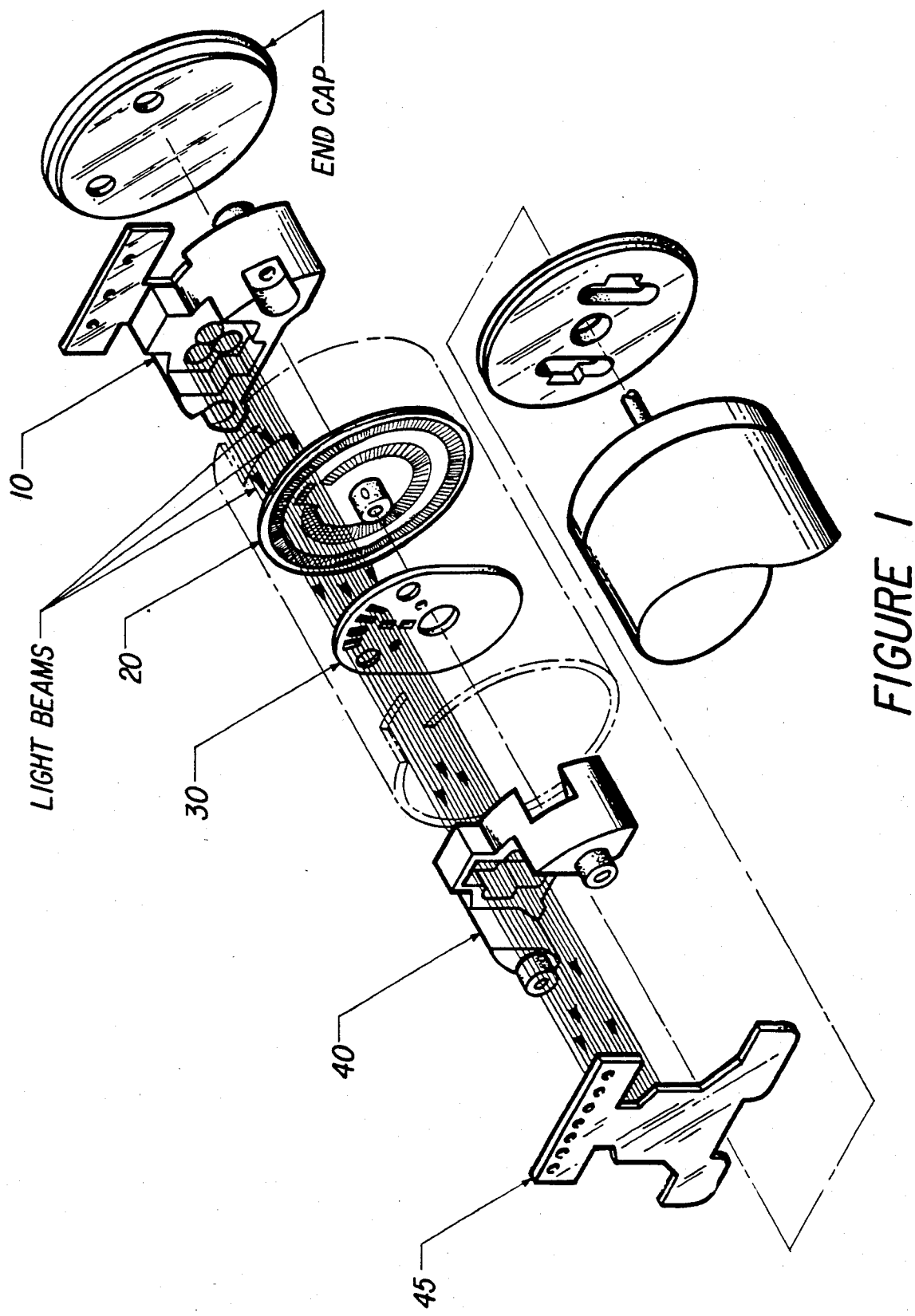
FIG. 1 is an exploded perspective view of an optical shaft angle encoder constructed with a preferred embodiment of the present invention.

In FIG. 1, there is shown an exploded perspective view of an optical shaft angle encoder constructed with a preferred embodiment of the present invention. Three collimated light beams are provided by an emitter module 10, which includes an emitter circuit board 15, and are modulated by the slots and bars located on an encoder, a rotating code wheel 20 in this case, and by the apertures located on a fixed phase plate 30. The modulated light beams are split and focused by a detector module 40 and are detected by photodetectors located on circuit board 45. The operation of the optical shaft angle encoder depicted in FIG. 1 may be better understood with reference to U.S. Pat. No. 4,266,125, which is incorporated herein by reference.

Figure 2:
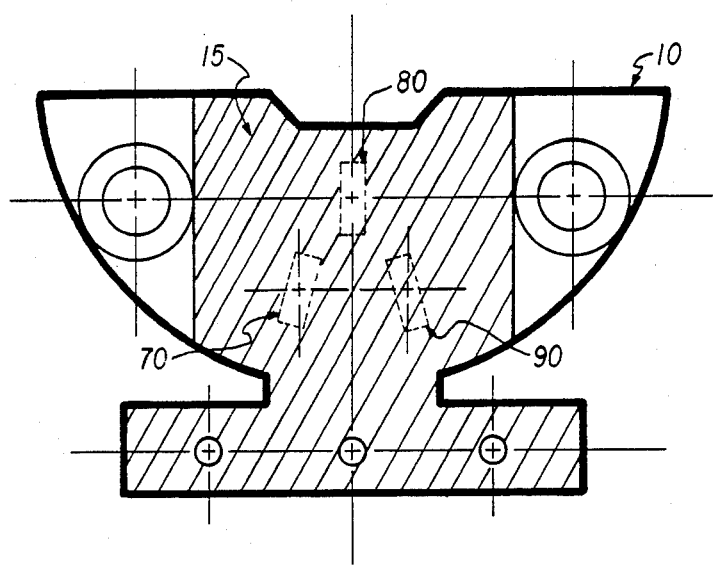
FIG. 2 is a back view of the emitter module depicted in FIG. 1.
Figure 3:
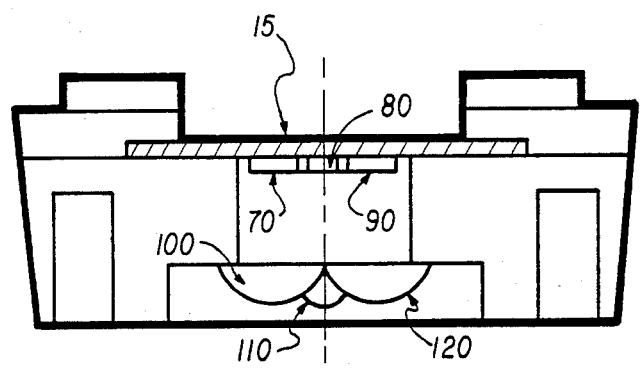
FIG. 3 is a top view of the emitter module depicted in FIG. 1.
Figure 4:
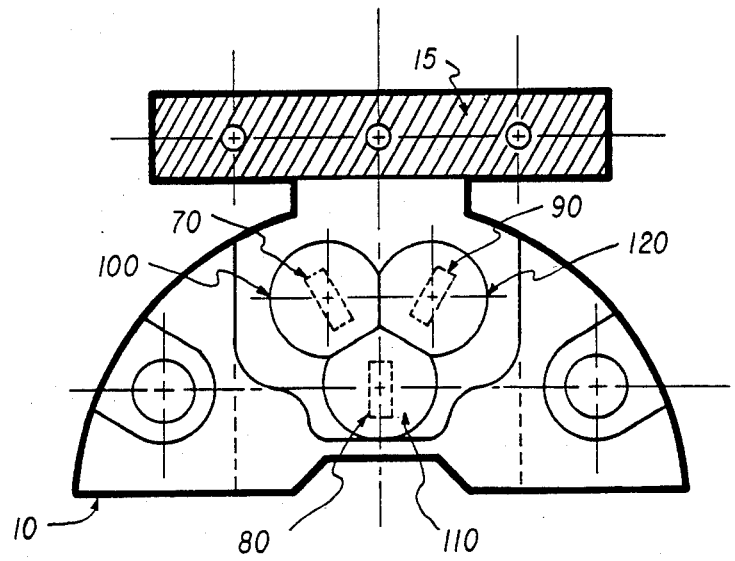
FIG. 4 is a front view of the emitter module depicted in FIG. 1.

FIGS. 2-4 illustrate back, top, and front views, respectively, of the emitter module 10 depicted in FIG. 1. Collimation lenses 100, 110, and 120 are positioned on the front of emitter module 10 to receive and collimate the light flux generated by slit emitters 70, 80, and 90, and to direct the three collimated light beams towards code wheel 20. The three slit emitters 70, 80, and 90 are bonded in a conventional manner to emitter circuit board 15. Emitter circuit board 15 is mounted to the back of emitter module 10. The exact mounting locations of slit emitters 70, 80, and 90 on emitter circuit board 15 must be determined with reference to the optical axes of collimation lenses 100, 110, and 120 and with reference to the slots on code wheel 20 and the apertures on phase plate 30. Slit emitters 70, 80, and 90 are oriented such that their centers, and hence the emitted light flux, are aligned with the optical axes of collimation lenses 100, 110, and 120, and such that they lie upon the same radial axes as do the slits in code wheel 20 and the apertures in phase plate 30 when the collimated light beams are modulated and consequently detected. In the direction perpendicular to the radial axes, the slit emitters each approximate collimation of light from individual point sources; and because of their elongation, the emitters are not degraded by low light flux output.

Figure 5:
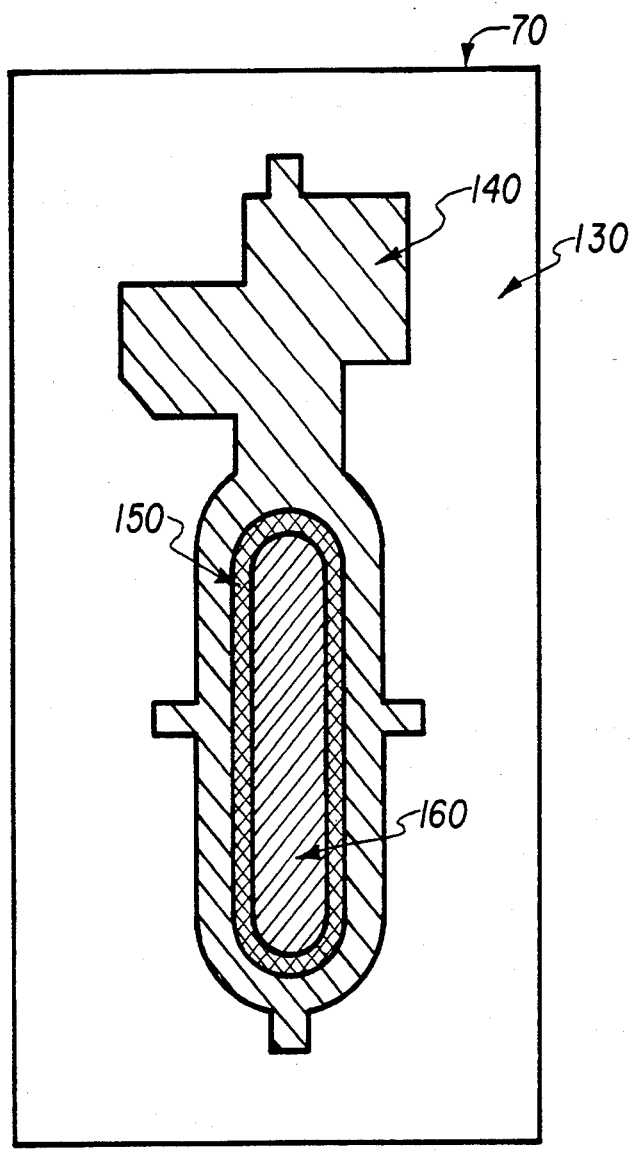
FIG. 5 is a detailed diagram of a slit emitter depicted in FIG. 2.

In FIG. 5, there is shown a detailed diagram of slit emitter 70. In the preferred embodiment of the present invention which is described herein slit emitters 70, 80, and 90 are identical with one another although this is not necessarily required in other applications. Persons of ordinary skill in the art will be able to design and construct slit emitters according to the preferred embodiment of the present invention. In other embodiments the slit emitters used may well have physical dimensions and performance characteristics which differ from those described herein for slit emitter 70.

Slit emitter 70, used in the preferred embodiment of the present invention and depicted in FIG. 5, was epitaxially grown in a well-known manner on a 0.2289 millimeter thick GaAs substrate. An aluminum area 140 provides locations for bond pads, probe pads, and alignment ticks. A GaAsP epitaxial junction area 150 is light emitting area 160 which measures 0.3175 millimeter by 0.0635 millimeter. During wafer testing, slit emitter 70 emitted light at a nominal wavelength of 700 nanometers with a minimum power density of 8.0 microwatts/sterradian when driven at $I_F=10$ microamperes.

In the direction perpendicular to the code wheel radial axis 20, the degree of collimation of the light beams passing out of collimation lenses 100, 110, and 120 is maximized when the width of light emitting area 160 is kept to the minimum. The lower limit on the width of light emitting area 160 is dependent upon both the metal etching techniques used during fabrication of slit emitter 70 and the level of current density which can be tolerated. In order to generate sufficient total power to activate the photodetectors located on circuit board 45 it is not necessary to increase the drive level of slit emitter 70. Instead, the length of light emitting area 160 is elongated to increase the emitted light power.

I claim:

1. A optical shaft angle encoder for generating an electrical signal in response to rotation of a shaft, comprising:

light emitting means for generating a uniaxially collimated beam, the light emitting means having a length dimension greater than a width dimension thereof;

a code wheel, concentrically, affixed to the shaft and positioned to receive the beam from the light emitting means and to modulate the beam, said wheel having a plurality of radially positioned transmissive slits therethrough;

detector means, positioned to receive the modulated beam from the encoder means, for generating the electrical signal indicative of rotation of the shaft; and wherein the length dimension of the light emitting means is located on and aligned with a radius of the shaft and the width dimension is orthogonal thereto and is substantially parallel to the code wheel.

2. An encoder as in claim 1, wherein:

the code wheel transmissive slits each have a width dimension which is substantially equal to the width dimension of the light emitting means; and the code wheel transmissive slits each have a length dimension, orthogonal to the width dimension, which is located on and aligned with a radii of the shaft.

3. An encoder as in claim 2, wherein the code wheel transmissive slits and the light emitting means are positioned substantially identical radial distances from the shaft such that succeeding transmissive slits are aligned with the light emitting means, and receive the beam therefrom, as the shaft rotates.

4. An encoder as in claim 3, wherein the length dimension of the light emitting means is at least five times as great as the width dimension thereof.

5. An encoder as in claim 4, wherein the length dimension of each of the transmissive slits is at least as great as the length dimension of the light emitting means.

6. An encoder as in claim 5, wherein the light emitting means comprises a first light emitting diode.

7. An encoder as in claim 5, wherein the light emtting means further comprises second and third light emitting diodes each having a length dimension located on and aligned with a radii of the shaft.

8. An encoder as in claim 7, further comprising phasing means, located between the detector means and the code wheel and positioned to receive the modulated beam therefrom, for phasing the modulated beam in a predetermined manner.

9. An encoder as in claim 8, further comprising lens means, located between the light emitting means and the code wheel, for focusing and further collimating the beam.

* * * * *